United States Patent
Yang et al.

(10) Patent No.: US 10,587,279 B1
(45) Date of Patent: Mar. 10, 2020

(54) DIGITAL TO ANALOG CONVERTER DEVICE AND CALIBRATION METHOD

(71) Applicant: Realtek Semiconductor Corporation, Hsinchu (TW)

(72) Inventors: Chih-Chieh Yang, Hsinchu (TW); Shih-Hsiung Huang, Miaoli County (TW); Liang-Huan Lei, Kaohsiung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/385,182

(22) Filed: Apr. 16, 2019

(30) Foreign Application Priority Data

Oct. 1, 2018 (TW) .............................. 107134712 A

(51) Int. Cl.
   *H03M 1/10* (2006.01)
   *H03M 1/06* (2006.01)
   *H03M 1/00* (2006.01)

(52) U.S. Cl.
   CPC .......... *H03M 1/1009* (2013.01); *H03M 1/001* (2013.01); *H03M 1/06* (2013.01); *H03M 1/1023* (2013.01)

(58) Field of Classification Search
   CPC ...... H03M 1/009; H03M 1/06; H03M 1/1023; H03M 1/001
   USPC .......................... 341/120, 118, 155, 144, 145
   See application file for complete search history.

(56) References Cited

U.S. PATENT DOCUMENTS

| | | | |
|---|---|---|---|
| 6,489,905 B1 * | 12/2002 | Lee ..................... | H03M 1/1057 341/120 |
| 9,991,900 B1 | 6/2018 | Kabir et al. | |
| 10,075,178 B1 * | 9/2018 | Yang ...................... | H03M 1/68 |
| 2016/0344401 A1 * | 11/2016 | La Grou ................. | H03M 1/08 |
| 2018/0097524 A1 * | 4/2018 | Chandra ............... | H03M 1/066 |

OTHER PUBLICATIONS

Mika P. Tiilikainen, "A 14-bit 1.8-V 20-mW 1-mm2 CMOS DAC", IEEE Journal of Solid-State Circuits, vol. 36, No. 7, Jul. 2001.
Meng-Hung Shen et al., "A Low Cost Calibrated DAC for High-Resolution Video Display System", IEEE Transactions on Very Large Scale Integration (VLSI) Systems, vol. 20, No. 9, Sep. 2012.
Chun-Cheng Liu et al., "A 10b 100MS/s 1.13mW SAR ADC with Binary-Scaled Error Compensation", ISSCC 2010, Session 21, Successive-Approximation ADCs / 21.5, Feb. 10, 2010.

* cited by examiner

*Primary Examiner* — Peguy Jean Pierre
(74) *Attorney, Agent, or Firm* — Locke Lord LLP; Tim Tingkang Xia, Esq.

(57) ABSTRACT

A digital-to-analog converter (DAC) device includes a DAC circuitry and a calibration circuitry. The DAC circuitry generates a first signal according to least significant bits of an input signal, and generates a second signal according to most significant bits of the input signal. The calibration circuitry compares the first signal with the second signal to generate a calibration signal, and calibrates the DAC circuitry according to the calibration signal. The calibration signal has bits. The calibration circuitry further repeatedly compares the first signal and the second signal to generate a plurality of comparison results when determining at least one bit of the bits, and performs a statistic operation according to the comparison results, in order to adjust the at least one bit, and a number of the at least one bit is less than a number of the bits.

20 Claims, 6 Drawing Sheets

US 10,587,279 B1

1

DIGITAL TO ANALOG CONVERTER DEVICE AND CALIBRATION METHOD

RELATED APPLICATIONS

This application claims priority to Taiwan Application Serial Number 107134712, filed Oct. 1, 2018, which is herein incorporated by reference in its entirety.

BACKGROUND

Technical Field

The present disclosure relates to a digital to analog converter (DAC) device. More particularly, the present disclosure relates to a current-steering DAC utilizing statistic operation.

Description of Related Art

Digital to analog converter (DAC) has been widely applied to various electronic devices. In related approaches, with the increasing of number of bits required to be processed, the number of circuits is increased, resulting in a significant increase in the required operating time.

SUMMARY

Some aspects of the present disclosure are related to a digital-to-analog converter (DAC) device that includes a DAC circuitry and a calibration circuitry. The DAC circuitry is configured to generate a first signal according to a plurality of least significant bits of an input signal, and to generate a second signal according to a plurality of most significant bits of the input signal. The calibration circuitry is configured to compare the first signal with the second signal to generate a calibration signal, and to calibrate the DAC circuitry according to the calibration signal. The calibration signal has a plurality of bits. The calibration circuitry is further configured to repeatedly compare the first signal and the second signal to generate a plurality of comparison results when determining at least one bit of the plurality of bits. The calibration circuitry is configured to perform a statistic operation according to the plurality of comparison results, in order to adjust the at least one bit, and a number of the at least one bit is less than a number of the plurality of bits.

Some aspects of the present disclosure are related to a calibration method, which is applied to a digital-to-analog converter (DAC) circuitry and includes the following operations: generating, by the DAC circuitry, a first signal according to a plurality of least significant bits of an input signal and generating a second signal according to a plurality of most significant bits of the input signal; comparing the first signal with the second signal to generate a calibration signal, in order to calibrate the DAC circuitry according to the calibration signal; and when determining at least one bit of a plurality of bits of the calibration signal, repeatedly comparing the first signal and the second signal to generate a plurality of comparison results, and performing a statistic operation according to the plurality of comparison results, in order to adjust the at least one bit, in which a number of the at least one bit is less than a number of the plurality of bits.

As described above, the DAC device and the calibration method provided in embodiments of the present disclosure utilize the statistic operation to adjust partial bits. As a result, the operating time of the calibration can be reduced while

2 the accuracy of the calibration is increased to improve the output resolution of the DAC device.

DETAILED DESCRIPTION

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in figures are designated with the same reference numbers.

Figure 1:
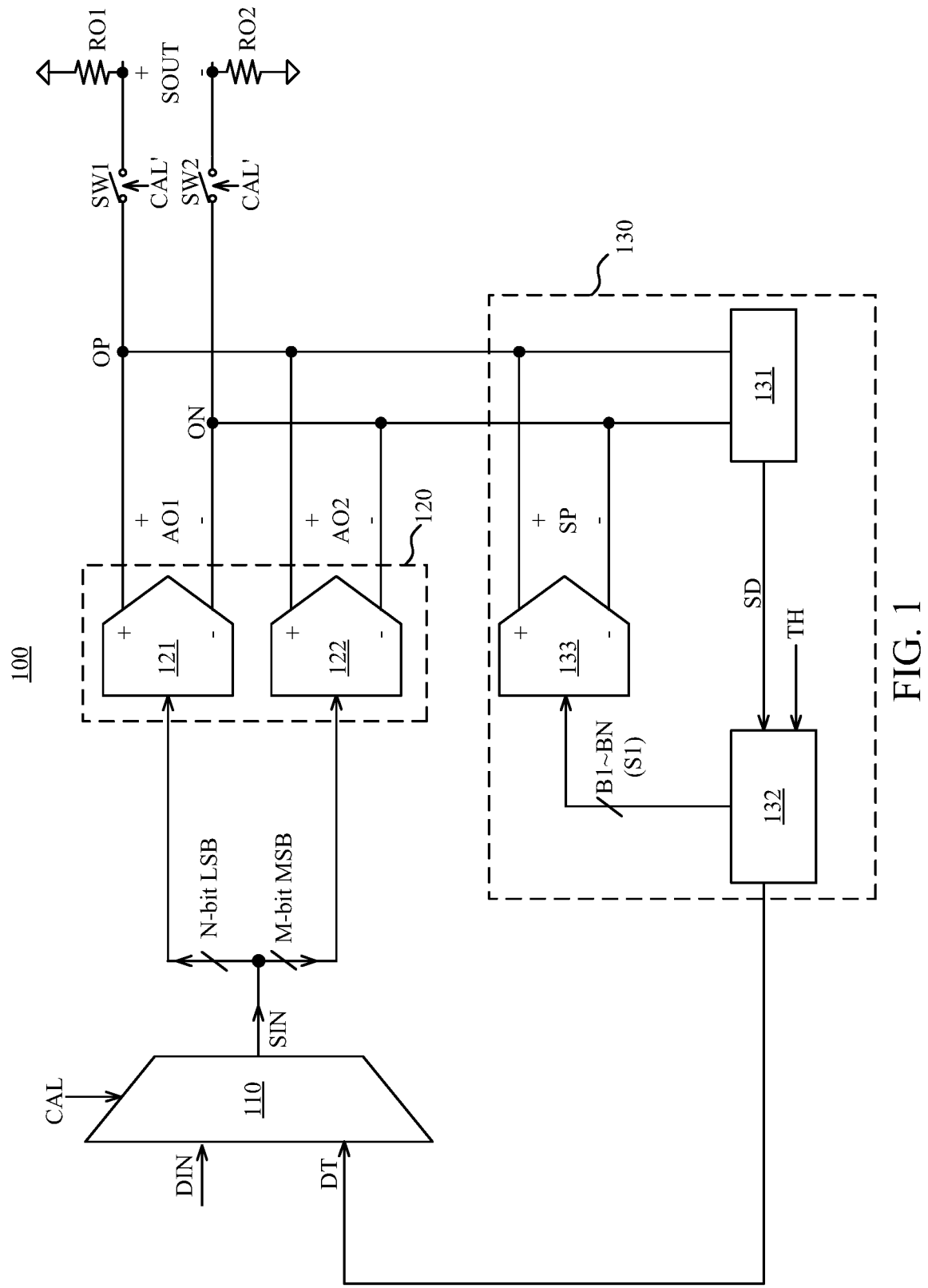
FIG. 1 is a schematic diagram of a digital-to-analog converter (DAC) device, according to some embodiments.

FIG. 1 is a schematic diagram of a digital-to-analog converter (DAC) device 100, according to some embodiments.

The DAC device 100 includes a multiplexer circuitry 110, a DAC circuitry 120, and a calibration circuitry 130. The multiplexer circuitry 110 selectively outputs one of the data signal DIN or a testing signal DT as an input signal SIN according to a mode control signal CAL. For example, when the mode control signal CAL has a logic value of 0, the DAC device 100 operates in a normal mode, and the multiplexer circuitry 110 outputs the data signal DIN as the input signal SIN. Alternatively, when the mode control signal CAL has a logic value of 1, the DAC device 100 operates in a calibration mode, and the multiplexer circuitry 110 outputs the testing signal DT as the input signal SIN.

The DAC circuitry 120 is coupled to the multiplexer circuitry 110 to receive the input signal SIN. The DAC circuitry 120 includes DAC circuits 121 and 122 and resistors RO1-RO2. The DAC circuit 121 generates a signal AO1 according to N least significant bits (LSB) of the input signal SIN. The DAC circuit 122 generates a signal AO2 according to M most significant bits (MSB) of the input signal SIN.

In some embodiments, the DAC circuitry 120 may be implemented with a current-steering DAC circuit. The current-steering DAC may be implemented with unity current source circuits, which may be turned on according to the input signal SIN, in order to output a corresponding current signal as signal AO1 or AO2. The resistors RO1-RO2 are coupled to output terminals OP and ON of the DAC circuits 121 and 122, respectively, in order to convert a summation of the signals AO1 and AO2 into an analog output SOUT as a voltage signal.

In some embodiments, the DAC device 100 further includes switches SW1-SW2. The switches SW1-SW2 are coupled to the output terminals of the DAC circuitry 120, and coupled to the resistors RO1-RO2, respectively. When operating in the calibration mode, the switches SW1-SW2 are not conducted in response to a mode control signal CAL' which is an inverse of the mode control signal CAL. As a result, in the calibration mode, the signals AO1-AO2 can be transmitted to the detector circuit 131 correctly. Alternatively, when operating in the normal mode, the switches SW1-SW2 are conducted in response to the mode control signal CAL'. As a result, in the normal mode, the signals AO1-AO2 can be transmitted to the resistors RO1-RO2.

In some embodiments, the calibration circuitry 130 is coupled to the DAC circuitry 120, and calibrates the DAC circuit 122 based on the signals AO1 and AO2 in the calibration mode. In some embodiments, the calibration circuitry 130 includes the detector circuit 131, a digital controller circuit 132, and a DAC circuit 133.

The detector circuit 131 is coupled to the output terminals OP and ON of the DAC circuits 121-122, in order to receive the signals AO1 and AO2. In some embodiments, the detector circuit 131 is configured to compare the signal AO1 with the signal AO2, in order to generate a detection signal SD. The detection signal SD is configured to indicate a comparison result of the signals AO1-AO2. In some embodiments, the detector circuit 131 may be implemented with a circuit, such as a current comparator or a quantizer, but the present disclosure is not limited thereto.

The digital controller circuit 132 is coupled to the multiplexer circuitry 110 and the detector circuit 131. In some embodiments, the digital controller circuit 132 is arranged with a memory (not shown), which stores a predetermined testing signal DT (and/or a predetermined time value TH discussed below), in order to provide the testing signal DT to the multiplexer circuitry 110 in the calibration mode. In some embodiments, the digital controller circuit 132 further performs a calibration operation in response to the detection signal SD, in order to generate a calibration signal S1.

For example, the digital controller circuit 132 may perform a successive approximation algorithm according to the detection signal SD, in order to determine bits B1-BN of the calibration signal S1. In some embodiments, when determining last K bits of the calibration signal S1, the digital controller circuit 132 further controls the detector circuit 131 to repeatedly compare the signal AO1 with the signal AO2 to generate multiple comparison results, in order to perform a statistic operation according to the multiple comparison results to adjust the K bits. In some embodiments, K is a non-zero positive integer. In some embodiments, a number of all bits of the calibration signal S1 is N, and K is less than N.

In some embodiments, the digital controller circuit 132 may be implemented with a digital signal processing circuit, one or more logic circuits, and/or a processing circuit that performs a finite state machine, but the present disclosure is not limited thereto.

The DAC circuit 133 is coupled to the DAC circuit 122 and the digital controller circuit 132. In some embodiments, the DAC circuit 133 outputs a compensation signal SP according to the calibration signal S1, in order to calibrate the DAC circuit 122. For example, if the DAC circuit 122 is a current-steering DAC implemented with multiple unity current sources, the compensation signal SP may be directly inputted into the DAC circuit 122, in order to calibrate a bias signal of a corresponding unity current source. As a result, the signal AO2 outputted from the DAC circuit 122 can be calibrated equivalently.

Alternatively, as shown in FIG. 1, in some embodiments, the DAC circuit 133 is directly coupled to the outputs of the DAC circuit 122. Under this arrangement, the DAC circuit 133 may turn on a corresponding unity current source(s) thereof according to the calibration signal S1, in order to generate a corresponding current signal (i.e., the compensation signal SP) to the outputs terminals OP and ON of the DAC circuit 122. As a result, the compensation signal SP is directly summed up with the signal AO2, in order to calibrate an offset of the DAC circuit 122 equivalently.

Figure 2:
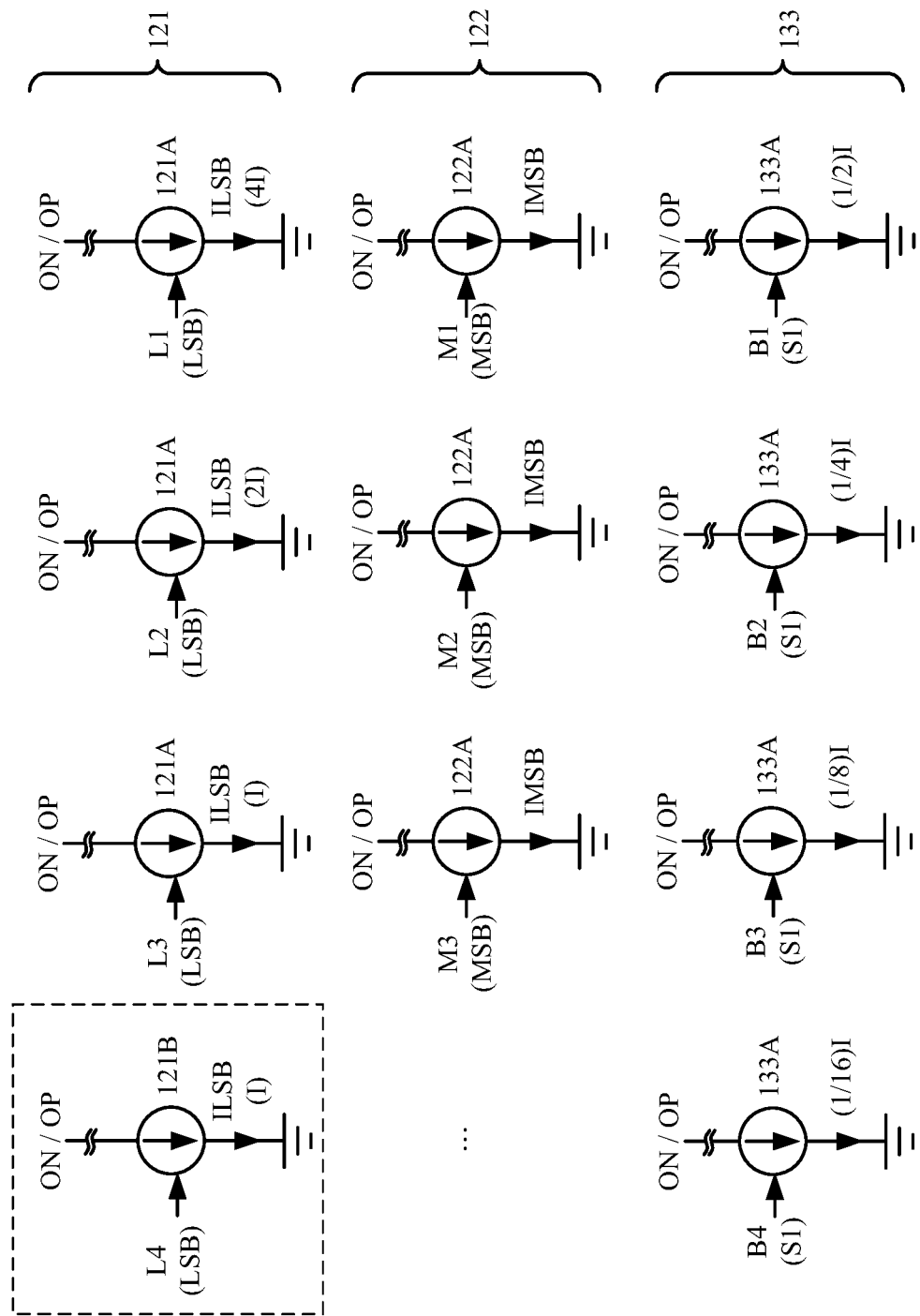
FIG. 2 is a schematic diagram illustrating arrangements of current source circuits in the DAC circuits in FIG. 1, according to some embodiments.

FIG. 2 is a schematic diagram illustrating arrangements of current source circuits in the DAC circuits 121, 122, and 133 in FIG. 1, according to some embodiments.

In some embodiments, the DAC circuits 121, 122, and 133 may be implemented with the current-steering DAC circuits. In this example, current sources circuits 121A are respectively controlled by bits L1-L3 of the LSB, current sources circuits 122A are respectively controlled by bits M1-M3 of the MSB, and current sources circuits 133A are respectively controlled by bits B1-BN of the calibration signal S1. In these embodiments, a corresponding relation is present between the current source circuits 121A of the DAC circuit 121 and the current source circuits 122A of the DAC circuit 122.

For example, if the LSBs are encoded with binary code, and the MSBs are encoded with thermometer code, currents of the current source circuits 121A (hereinafter referred to as "current ILSB") are different by 2 in sequence. For example, as shown in FIG. 2, the currents ILSB of the current source circuits 121A (i.e., the current source circuits 121A corresponding to the bits L1-L3) are different by 2 in sequence. As shown in FIG. 2, the DAC circuit 133 includes the current source circuits 133A, which have currents different by 2 in sequence (e.g., $(1/2)*I$, $(1/4)*I$, $(1/8)*I$, and $(1/16)*I$). In some embodiments, a resolution of the DAC circuit 133 is higher than a resolution of the DAC circuit 122.

Ideally, a summation of the currents ILSB is expected to be equal to a current of a single current source circuit 122A (hereinafter referred to as "IMSB"). In other words, $\Sigma$ ILSB=IMSB (hereinafter referred to as "equation 1"). However, an offset may be present in the current IMSB due to factor(s) including process variations, such that the equation 1 cannot be satisfied. In some embodiments, the DAC circuit 121 may further include an additional current source circuit 121B that has a current I and is controlled by the bit L4. Under this condition, ideally, $\Sigma$ILSB=IMSB.

Therefore, when operating in the calibration mode, the digital controller circuit 132 may output the testing signal DT having specific bit values. In an initial testing, all of low weighted bits (i.e., the bits L1-L4 of the LSB) of the testing signal DT are 1, and a corresponding one of high weighted bits (i.e., the bits M1-M3 of the MSB) of the testing signal DT is 1. Under this condition, all of current source circuits 121A are turned on to output all currents ILSB to one output terminal (e.g., output terminal ON) as the signal AO1. A corresponding one of the current source circuits 122A is turned on to output a single current IMSB to another one output terminal (e.g., output terminal OP) as the signal AO2. With this arrangement, the detector circuit 131 is able to compare the signal AO1 with the signal AO2, in order to determine whether the equation 1 is satisfied. If the equation 1 is not satisfied, the detector circuit 131 is able to output a corresponding detection signal SD.

Moreover, the digital controller circuit 132 may perform the calibration operation (e.g., binary search or successive approximation algorithms) in response to the detection signal SD, in order to determine the bits B1-BN of the calibration signal S1. The at least one current source circuit 133A is turned on according to the bits B1-BN, in order to output a corresponding current as the compensation signal SP. In some embodiments, the compensation signal SP may be directly summed up with the signal AO2, in order to equivalently calibrate the DAC circuit 122, as shown in FIG.

1. In other words, the equation 1 may be amended as ILSB=IMSB+SP (hereinafter referred to as "equation 2".) Accordingly, by performing the above one or more operations sequentially, the digital controller circuit 132 is able to determine an offset that is required to be calibrated for the single current source circuit 122A, and to record the corresponding calibration signal S1 to a memory (not shown) thereof.

After a corresponding compensation signal SP for the single current source circuit 122A is recorded, the digital controller circuit 132 is able to update the corresponding one bit of the MSBs in the testing signal DT to 0, and to update a next one bit of the MSBs in the testing signal DT to 1, and then performs the above operations again. With this analogy, the digital controller circuit 132 can store the calibration signals S1 corresponding to all current source circuits 122A as a look-up table or the like. As a result, when one current source circuit 122A is turned on, the digital controller circuit 132 is able to output a corresponding calibration signal S1, in order to control the DAC circuit 133 to output the corresponding compensation signal SP to calibrate the DAC circuit 122.

For ease of understanding, the signals AO1 and AO2 and the compensation signal SP in FIG. 1 are illustrated in a simplified way. In practical applications, the signal AO1 may be a summation of current (or voltage) signals (e.g., current ILSB) outputted from the DAC circuit 121, the signal AO2 may be a summation of current (or voltage) signals (e.g., current IMSB) outputted from the DAC circuit 122, and the compensation signal SP may be a summation of current signals outputted from the DAC circuit 133. With different types of signals, the detector circuit 131 may employ different circuit configurations to determine whether the equation 2 is satisfied. For example, if the above signals are current signals, the detector circuit 131 may be implemented with a current comparator and a switching circuit. The switching circuit is for swapping transmitting paths of current signals corresponding to the signals AO1 and AO2, such that the current comparator is able to acquire sufficient information to determine whether the equation 2 is satisfied.

Figure 3:
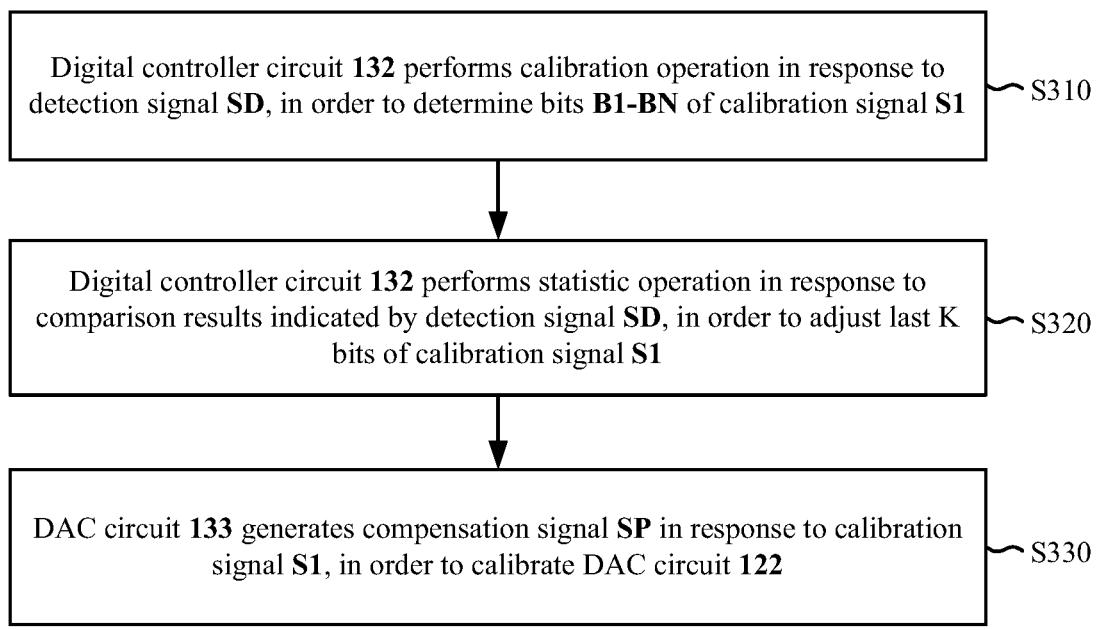
FIG. 3 is a flow chart of a calibration method, according to some embodiments.

FIG. 3 is a flow chart of a calibration method 300, according to some embodiments. In some embodiments, the calibration method 300 may be performed by the DAC device 100 in FIG. 1.

In operation S310, the digital controller circuit 132 performs the calibration operation in response to the detection signal SD, in order to determine the bits B1-BN of the calibration signal S1.

Figure 4:
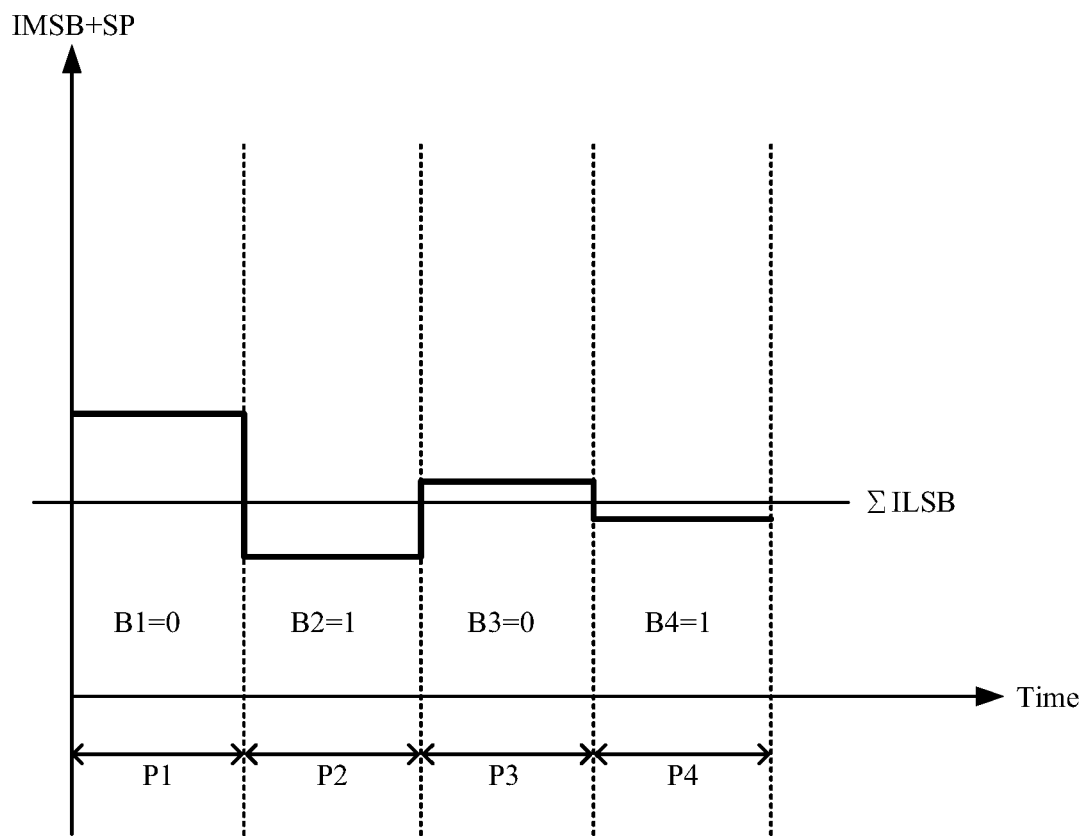
FIG. 4 is a schematic diagram illustrating an operation in FIG. 3 according to some embodiments.

FIG. 4 is a schematic diagram illustrating operation S310 in FIG. 3 according to some embodiments. In this example, the digital controller circuit 132 performs a successive approximation algorithm, in order to determine the bits B1-BN of the calibration signal S1. In the progress of performing the successive approximation algorithm, the digital controller circuit 132 enters in a bit conversion phase. The bit conversion phase includes conversion intervals P1-PN. Each conversion interval P1-PN is for determining a corresponding bit. For example, the bit BN is determined in the conversion interval PN.

For ease of understanding, in this example, N is set to 4, but the present disclosure is not limited thereto. During the conversion interval P1, the detector circuit 131 performs a first comparison of the signals AO1 (which may equal to E ILSB) and AO2 (which may equal to IMSB+SP), and thus determines that E ILSB is less than IMSB+SP. The detector circuit 131 generates a corresponding detection signal SD to indicate this comparison result. The digital controller circuit 132 determines the bit B1 of the calibration signal S1 as 0 in response to the detection signal SD. Then, during the conversion interval P2, the detector circuit 131 performs a second comparison of the signals AO1 and AO2, and determines that E ILSB is greater than IMSB+SP. The digital controller circuit 132 determines the bit B2 of the calibration signal S1 as 1 in response to the detection signal SD. By this analogy, during the conversion interval P3, the bit B3 is determined as 0, and during the conversion interval P4, the bit B4 is determined as 1.

With continued reference to FIG. 3, in operation S320, the digital controller circuit 132 performs a statistic operation in response to the comparison results indicated by the detection signal SD, in order to adjust last K bits of the calibration signal S1.

In operation S330, the DAC circuit 133 generates the compensation signal SP in response to the calibration signal S1, in order to calibrate the DAC circuit 122.

As mentioned above, K is less than N. For ease of understanding, the following descriptions are given with an example where K=1, but the present disclosure is not limited thereto. In regard to the last one bit B4, the digital controller circuit 132 may control the detector circuit 131 to repeatedly compare the signal AO1 with the signal AO2, in order to generate multiple detection signals SD. According to multiple comparison results respectively indicated by the multiple detection signals SD, the digital controller circuit 132 may performs the statistic operation to adjust the last one bit B4. In some embodiments, the statistic operation may be a majority-vote operation. Alternatively, in some embodiments, the statistic operation may be a weighted operation.

Figure 5:
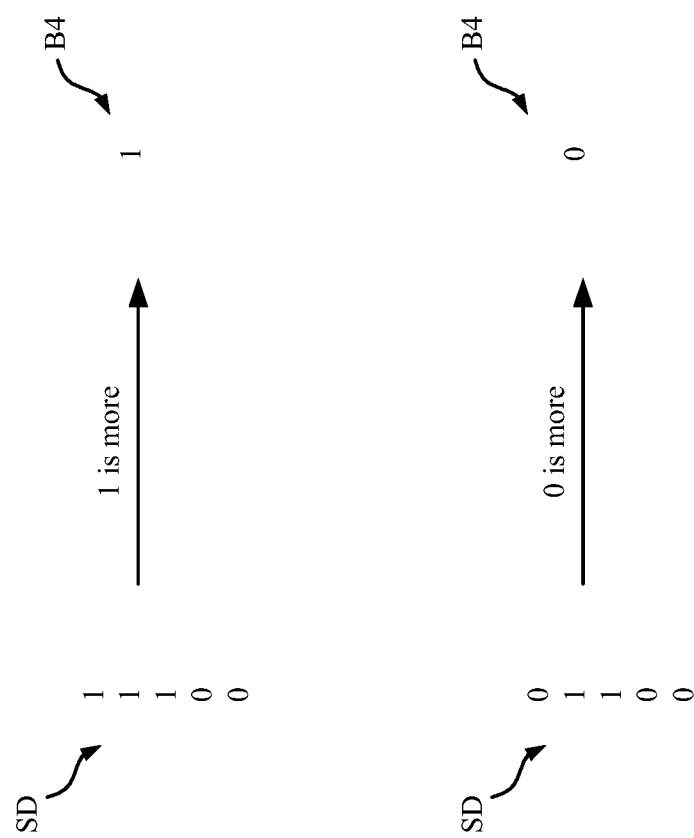
FIG. 5 is a schematic diagram of performing a majority-vote operation according to some embodiments.

FIG. 5 is a schematic diagram of performing the majority-vote operation according to some embodiments of the present disclosure. As shown in FIG. 5, during the conversion interval P4 for determining the bit B4, the detector circuit 131 performs five comparisons of the signals AO1 and AO2, in order to sequentially generate five detection signals SD. In response to the five detection signals SD, the digital controller circuit 132 determines that the bit B4 is values of 1, 1, 1, 0, and 0 in sequence by the calibration operation. Under this condition, as the number of 1 is bigger, the digital controller circuit 132 determines the bit B4 as the value of 1 by the majority-vote operation. Alternatively, the bit B4 is determined to as values of 0, 1, 1, 0, and 0 in sequence. Under this condition, as the number of 0 is bigger, the bit B4 is determined to as the value of 0.

Figure 6:
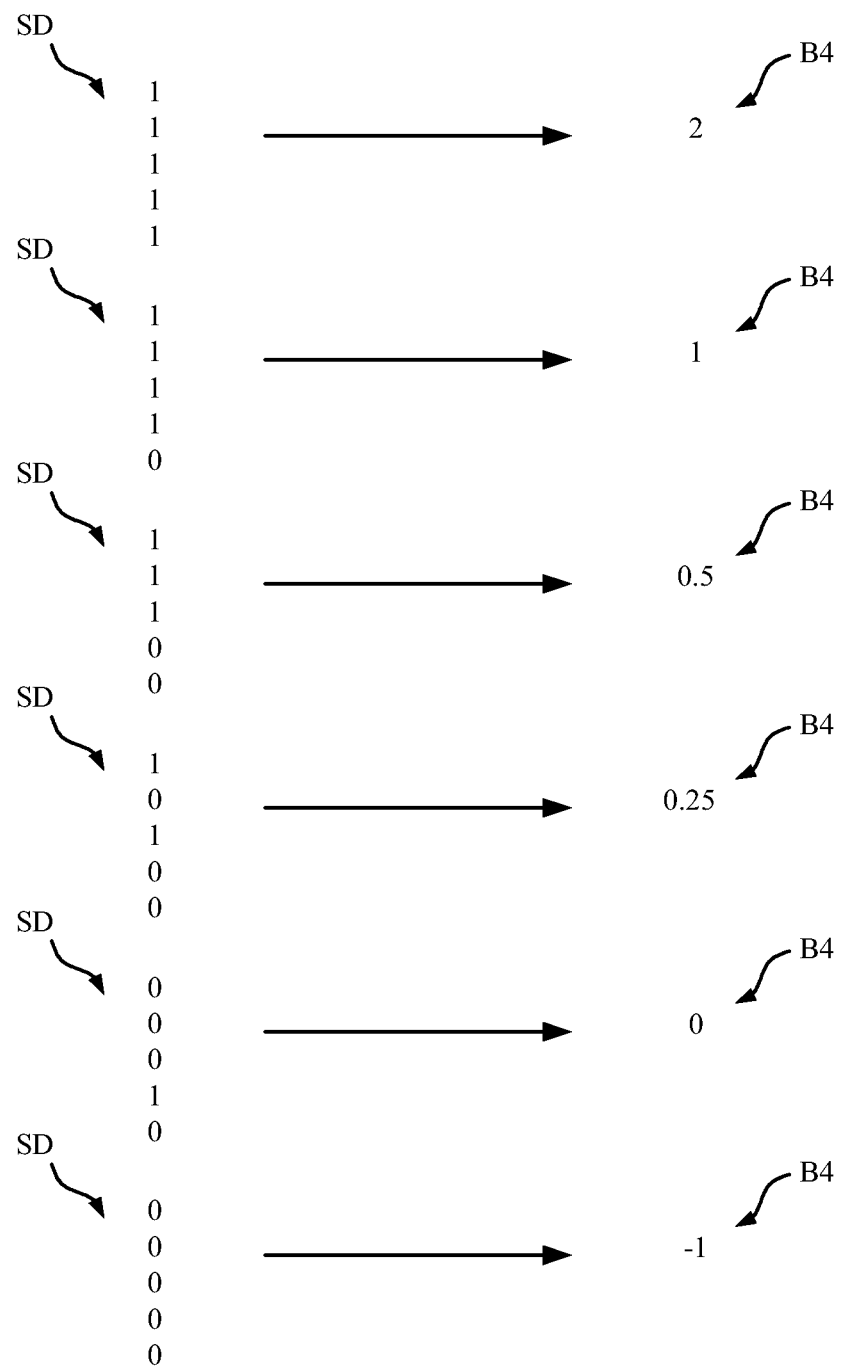
FIG. 6 is a schematic diagram of performing a weighted operation according to some embodiments.

FIG. 6 is a schematic diagram of performing the weighted operation according to some embodiments of the present disclosure. As shown in FIG. 6, during the conversion interval P4 for determining the bit B4, the detector circuit 131 performs five comparisons of the signals AO1 and AO2, in order to generate five detection signals SD in sequence.

If all of the five detection signals are values of 1, the digital controller circuit 132 encodes the bit B4 as 2. If the five detection signals SD include four values of 1 and one value of 0, the digital controller circuit 132 encodes the bit B4 as 1. If the five detection signals SD include three values of 1 and two values of 0, the digital controller circuit 132 encodes the bit B4 as 0.5. If the five detection signals SD include two values of 1 and three values of 0, the digital controller circuit 132 encodes the bit B4 as 0.25. If the five detection signals SD include one value of 1 and four values of 0, the digital controller circuit 132 encodes the bit B4 as 0. If all of the five detection signals are values of 0, the digital controller circuit 132 encodes the bit B4 as −1.

In this example, different codes correspond to different levels. In some embodiments, the DAC circuit 133 includes more current source circuits, in order to generate the different levels corresponding to the different codes. For example, the DAC circuit may further include a first current source circuit having a current of $(1/16)*I$. When the bit B4 is encoded as 2, two current source circuits that have the current of $(1/16)*I$ (i.e., the original and the first current source circuits) are turned on, and the two current source circuits and the current source circuit 122A that corresponds to the MSB are connected to the same output terminal; when the bit B4 is encoded as −1, the first current source circuit is turned on, but the first current source circuit and the current source circuit 122A that corresponds to the MSB are connected to different output terminals. In another example, the DAC circuit 133 may further include a current source circuit having a current of $(1/32)*I$. When the bit B4 is encoded as 0.5, the current source circuit having the current of $(1/32)*I$ is turned on, and the current source circuit having the current of $(1/32)*I$ and the current source circuit 122A that corresponds to the MSB are connected to the same output terminal.

Compared with FIG. 5, the bit B4 can be encoded as a multi-level digital code according to the multiple comparison results. As a result, the DAC circuit 133 can generate a more accurate compensation signal SP to calibrate the DAC circuit 122.

In some approaches, in order to increase the accuracy of the calibration, N bits of the calibration signal (e.g., B1-BN) are set to be determined by an average value of multiple sets of digital codes generated from multiple bit conversion phases. For example, if the calibration signal has 4 bits, 1024 bit conversion phases are required to obtain 1024 sets of digital codes (e.g., B1-B4) in these approaches, and then these 1024 sets of digital codes are averaged to obtain the 4 bits of the calibration signal. As a result, the entire calibration progress at least takes 1024*4 conversion intervals.

Compared with the above approaches, the digital controller circuit 132 only performs the repetitious comparisons when determining last K bits of the calibration signal. As a result, the required time of the calibration progress can be reduced. In addition, as an analog signal (i.e., the input of the detector circuit 131) corresponding to the last K bits is relatively small, the comparison result of the detector circuit 131 may be wrong due to impacts from noises. By adjusting the last K bits using statistic operation according to the multiple comparison results, the chance of getting wrong result of the detector circuit 131 can be reduced effectively, in order to improve the accuracy of the calibration. In some embodiments, during the conversion intervals for determining the last K bits, if the number of multiple comparisons performed by the detector circuit 131 is more, the accuracy of the calibration is higher. In some embodiments, the number of multiple comparisons performed by the detector circuit 131 may be predetermined according to practical requirements (e.g., calibration time, accuracy, etc.).

In some embodiments, the value of K may be predetermined. In other words, when entering the conversion intervals for determining the K bits, the digital controller circuit 132 may start performing operation S320.

Alternatively, in some other embodiments, the digital controller circuit 132 may determine whether to perform operation S320 according to a transiting time of the detection signal SD (i.e., a time for transiting from the logic value of 1 to the value of 0, or a time for transiting from the logic value of 0 to the value of 1). As mentioned above, the analog signal corresponding to the last K bits is relatively smaller, and the detector circuit 131 may require a longer operating time to generate the detection signal SD. Equivalently, the transiting time of the detection signal SD may be longer when determining the last K bits. In some embodiments, as shown in FIG. 1, the digital controller circuit 132 may compares the transiting time of the detection signal SD with a predetermined time value TH. During the interval for determining one of bits B1-BN, if the transition time of the detection signal is longer than the predetermined time value TH, the digital controller circuit 132 may determine whether to perform multiple comparisons to perform the statistic operation, in order to adjust the corresponding bit of the calibration signal S1. In some embodiments, the predetermined time value TH may be set according to the transiting time of the detection signal SD with respect to the current ILSB (e.g., current I), and may be adjusted according to practical requirements.

As described above, the DAC device and the calibration method provided in embodiments of the present disclosure utilize the statistic operation to adjust partial bits. As a result, the operating time of the calibration can be reduced while the accuracy of the calibration is increased to improve the output resolution of the DAC device.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A digital-to-analog converter (DAC) device, comprising:
    a DAC circuitry configured to generate a first signal according to a plurality of least significant bits of an input signal, and to generate a second signal according to a plurality of most significant bits of the input signal; and
    a calibration circuitry configured to compare the first signal with the second signal to generate a calibration signal, and to calibrate the DAC circuitry according to the calibration signal,
    wherein the calibration signal has a plurality of bits, the calibration circuitry is further configured to repeatedly compare the first signal and the second signal to generate a plurality of comparison results when determining at least one bit of the plurality of bits, the calibration circuitry is configured to perform a statistic operation according to the plurality of comparison results, in order to adjust the at least one bit, and a number of the at least one bit is less than a number of the plurality of bits.

2. The DAC device of claim 1, wherein the at least one bit is a last bit of the plurality of bits.

3. The DAC device of claim 1, wherein the at least one bit comprises last K bits of the plurality of bits, and K is a non-zero positive integer.

4. The DAC device of claim 1, wherein the calibration circuitry comprises:
   a detector circuit configured to compare the first signal with the second signal, in order to generate a detection signal that is configured to indicate the plurality of comparison results;
   a digital controller circuit configured to perform a calibration operation according to the detection signal to generate the calibration signal,
   wherein when determining the at least one bit, the digital controller circuit is further configured to perform the statistic operation according to the detection signal, in order to adjust the at least one bit; and
   a DAC circuit configured to generate a compensation signal according to the plurality of bits of the calibration signal, in order to calibration the DAC circuitry.

5. The DAC device of claim 4, wherein the statistic operation is a majority-vote operation, and the digital controller circuit is configured to perform the majority-vote operation according to the plurality of comparison results indicated by the detection signal, in order to adjust the at least one bit.

6. The DAC device of claim 4, wherein the statistic operation is a weighted operation, and the digital controller circuit is configured to perform the weighted operation according to the plurality of comparison results indicated by the detection signal, in order to adjust the at least one bit.

7. The DAC device of claim 6, wherein the at least one bit is encoded as a multi-level digital code.

8. The DAC device of claim 4, wherein the digital controller circuit is further configured to compare a transiting time of the detection signal with a predetermined time value, in order to determine whether to perform the statistic operation.

9. The DAC device of claim 4, wherein the calibration operation comprises a successive approximation algorithm.

10. The DAC device of claim 1, wherein the DAC circuitry comprises:
    a first DAC circuit configured to generate the first signal according to the plurality of least significant bits; and
    a second DAC circuit configured to generate the second signal according to the plurality of most significant bits,
    wherein each of the first DAC circuit and the second DAC circuit is implemented with a current-steering DAC circuit.

11. A calibration method, applied to a digital-to-analog converter (DAC) circuitry, the calibration method comprising:
    generating, by the DAC circuitry, a first signal according to a plurality of least significant bits of an input signal, and generating a second signal according to a plurality of most significant bits of the input signal;
    comparing the first signal with the second signal to generate a calibration signal, in order to calibrate the DAC circuitry according to the calibration signal; and
    when determining at least one bit of a plurality of bits of the calibration signal, repeatedly comparing the first signal and the second signal to generate a plurality of comparison results, and performing a statistic operation according to the plurality of comparison results, in order to adjust the at least one bit,
    wherein a number of the at least one bit is less than a number of the plurality of bits.

12. The calibration method of claim 11, wherein the at least one bit is a last bit of the plurality of bits.

13. The calibration method of claim 11, wherein the at least one bit comprises last K bits of the plurality of bits, and K is a non-zero positive integer.

14. The calibration method of claim 11, wherein comparing the first signal with the second signal to generate the calibration signal comprises:
    comparing the first signal with the second signal, in order to generate a detection signal that is configured to indicate the plurality of comparison results;
    performing a calibration operation according to the detection signal to generate the calibration signal; and
    generating a compensation signal according to the plurality of bits of the calibration signal, in order to calibration the DAC circuitry.

15. The calibration method of claim 14, wherein the statistic operation is a majority-vote operation, and performing the statistic operation comprises:
    performing the majority-vote operation according to the plurality of comparison results indicated by the detection signal, in order to adjust the at least one bit.

16. The calibration method of claim 14, wherein the statistic operation is a weighted operation, and performing the statistic operation comprises:
    performing the weighted operation according to the plurality of comparison results indicated by the detection signal, in order to adjust the at least one bit.

17. The calibration method of claim 14, further comprising:
    comparing a transiting time of the detection signal with a predetermined time value, in order to determine whether to perform the statistic operation.

18. The calibration method of claim 14, wherein the calibration operation comprises a successive approximation algorithm.

19. The calibration method of claim 11, wherein the at least one bit is encoded as a multi-level digital code.

20. The calibration method of claim 11, wherein the DAC circuitry is implemented with a current-steering DAC circuit.

* * * * *